United States Patent

[11] 3,574,412

[72] Inventors Joe V. Stover;
Thomas J. Fox, Fullerton, Calif.

[21] Appl. No. 735,097

[22] Filed June 6, 1968

[45] Patented Apr. 13, 1971

[73] Assignee Hughes Aircraft Company
Culver City, Calif.

[54] CAPACITOR-TRANSFORMER VOLTAGE EQUALIZATION NETWORK FOR SERIES CONNECTED TRANSISTOR SWITCHES

8 Claims, 1 Drawing Fig.

[52] U.S. Cl. .......... 302/255, 307/246, 307/288, 307/297, 330/18

[51] Int. Cl. .......... H03k17/00, H03k 1/12

[50] Field of Search .......... 307/255, 254, 297, 202, 246, 288; 330/18

[56] References Cited

UNITED STATES PATENTS 3,181,010 4/1965 Cotten .......... 307/255

3,274,505 9/1966 Frisch .......... 330/18

*Primary Examiner*—Donald D. Forrer

*Assistant Examiner*—David M. Carter

*Attorneys*—James K. Haskell and Allen A. Dicke, Jr.

ABSTRACT: During the turnoff transition of series connected complementary transistor pair switches against a voltage in excess of the permissible standoff voltage of any one switch, it becomes necessary to equalize the voltage drop across each switch. Such equalization is accomplished by connecting a capacitor between the collector and base of each transistor in a complementary pair switch, with the capacitor having a larger displacement current than the collector current of that transistor. In this way, the rate of change of the collector to base voltage is maintained substantially equal between the several series connected transistors. This maintains substantially equal standoff voltage in each transistor during rise and fall times, providing transistor storage times are equal and turnoff signals are received at the same time. In order to overcome this potential cause of excessive voltage against any complementary pair transistor switch, pulse transformers are connected with one coil in series with the capacitor and the other coil in series with the emitter of the majority current carrying transistor so that the capacitive displacement current provides a voltage pulse in series aiding with the base-to-emitter voltage of the minority current carrying transistor to slow the transition speed of the succeeding complementary transistor pair switch first turning off and to allow its transition speed to approach that of the slower transition speed switch elements.

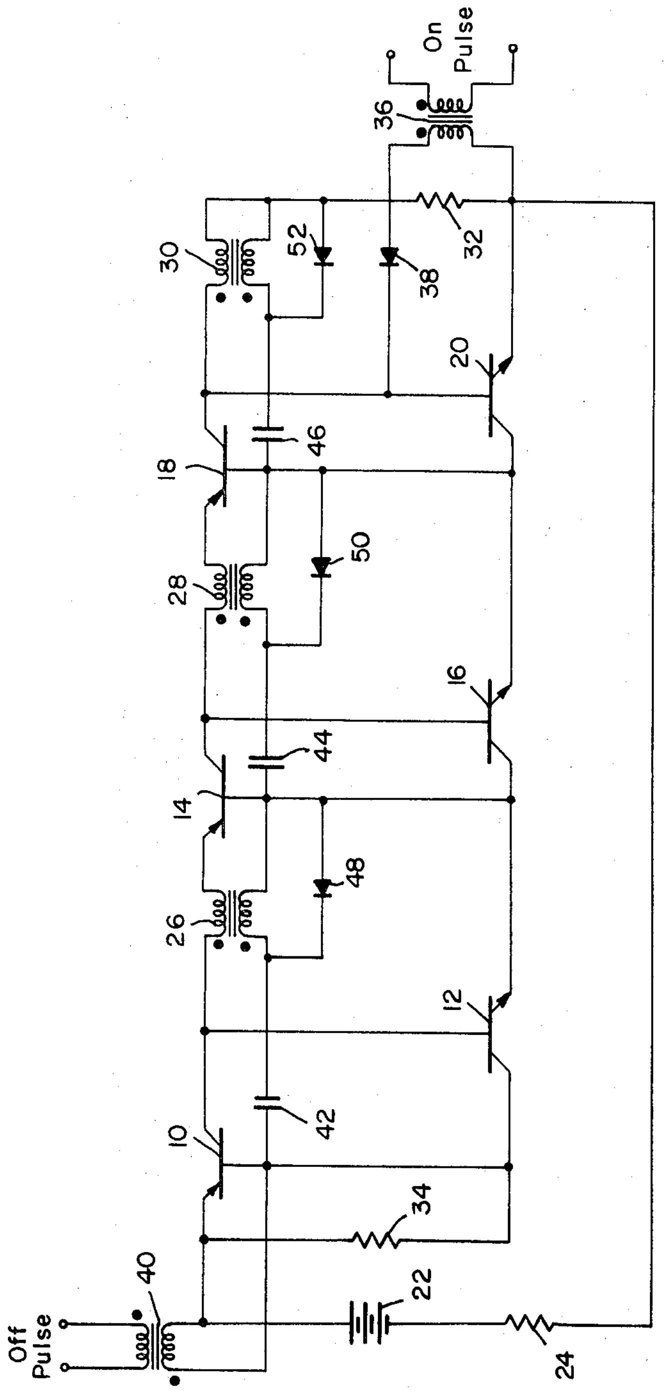
Joe V. Stover,
Thomas J. Fox,
INVENTORS.
ALLEN A. DICKE, Jr.,
AGENT.

CAPACITOR-TRANSFORMER VOLTAGE EQUALIZATION NETWORK FOR SERIES CONNECTED TRANSISTOR SWITCHES

BACKGROUND

This invention is directed to serially connected complementary pair transistor switches and particularly to a capacitor-transformer voltage equalization network connected to equalize the voltages between transistor switch elements during transition.

The voltage ratings of transistor switches have risen with development of improved devices, and the current carried thereby has also increased with development. However, both voltage and current capabilities of existing devices are insufficient to meet the rigors of some applications for which their solid state switching ability and speed would be eminently suitable. Lack of sufficient current carrying capacity can fairly easily be remedied by providing a plurality of switches in parallel. Few problems arise in equalizing the current loads in such parallel operations. However, in order to make presently available devices adequately solve the need for higher voltage standoffs, such transistor switch elements must be arranged in series.

Placing paralleled resistance capacitance networks across each of a plurality of serially connected diodes to divide the voltage across the diodes and to provide high voltage capabilities of the serially connected diodes has been successful. However, the placement of such paralleled resistance capacitance networks in shunt across serially connected transistors has been totally unsatisfactory where high switching speeds at high collector current levels are desired. Such circuits have been successful with diodes and unsuccessful with transistors because of the storage time in transistors at these high collector current levels and the relatively large value of shunt capacitance required whose energy must be dissipated by the switch upon turn on.

SUMMARY

The capacitor-transformer voltage equalization network provides equalization or fairly equal division of voltage across series connected transistor pair switches during the transition of such switches to the off state. The equalization or division of voltage is accomplished by a capacitor effectively connected from base to collector of each transistor switch, with the capacitor having a larger displacement current than the collector current. This causes an equalization of the change in voltage with respect to time at the several transistors. As an additional equalizing factor, in order to overcome the problems of delay caused by different storage time, or by different receipt of the turnoff signal in each transistor, a transformer is associated with each transistor switch element and arranged with a coil in series with the emitter of the succeeding switch element and another coil in series with the associated capacitor. Thus, the faster transistor switch elements are slowed by the surge of capacitive displacement current through the pulse transformer so that the transistor first turning off is delayed and its transition speed is allowed to approach that of the slower transition speed transistor switches.

Accordingly, it is an object of this invention to provide voltage equalization networks which can operate with series connected transistor switches so that the standoff voltage during turnoff applied to each of the serially connected transistor switch elements is sufficiently equalized to that of the other transistor switches so that none of the transistors has voltage applied thereto in excess of the tolerable standoff voltage. It is a further object to provide a voltage equalizing network for each of a plurality of serially connected complementary transistor pair switches wherein the network comprises a capacitor connected between the bases of adjacent complementary transistor pair switch elements wherein the capacitor has a larger displacement current than the collector current. It is a further object of this invention to provide serially connected complementary transistor pair switch elements of the configuration shown in the drawings with voltage equalizing networks, each network being connected between adjacent transistor switch elements, and each network comprising a capacitor connected between the bases of adjacent transistor switch elements through a transformer having one coil serially connected to the capacitor and the other coil serially connected to the emitter of the adjacent majority current carrying transistor to slow the response time of the fastest acting transistor to approach that of the slower transition speeds of other transistors.

DESCRIPTION OF THE DRAWING

The single FIGURE of the drawing is an electrical schematic diagram of a preferred embodiment of the capacitor-transformer voltage equalization network for series connected complementary transistor pair switches shown in an illustrative circuit wherein three complementary transistor pair switches are serially connected.

DESCRIPTION

When transistors are serially connected, without circuitry which makes them a part of bistable circuitry, a considerable amount of base drive power is necessary to maintain the transistors either in the low- or the high-impedance state. Thus, it is preferred that serially connected transistors be connected as part of bistable circuitry and for this reason complementary pairs of transistors are shown in the drawing and represent the preferred embodiment to which the capacitor-transformer voltage equalization network of this invention is preferably applied. Referring to the drawing, the first complementary pair is comprised of PNP transistor 10 and NPN transistor 12. These are connected in such a manner as to form a bistable switching circuit. They are serially connected to transistors 14 and 16 which form a further complementary pair. Additionally, transistors 18 and 20 form a third complementary pair included in the series circuit.

Any number of serially connected complementary pairs can be used so that the total voltage supplied by power source 22 through load 24 can be divided across these serially connected transistors with the voltage impressed across any transistor not exceeding the tolerable standoff voltage of the transistors, even though the voltage of power source 22 is in excess of the tolerable standoff voltage of any one of the series connected transistors. In other words, the voltage of the source is divided sufficiently equally across the transistors, during transition to the off state and while in the off state, that the series connection can withstand fairly high voltages. Additionally, the number connected in series can be arranged in sufficient number that any voltage from the power source can be switched. For higher voltages, more serially connected transistors are used. For illustration, three are shown but from this discussion, it is understood that any required number can be used.

As is seen in the drawing, the emitter of transistor 10 is directly connected to power source 22, while its collector is connected through the secondary of pulse transformer 26 to the emitter of transistor 14. Similarly, transistor 14 has its collector connected through the secondary of pulse transformer 28 to the emitter of transistor 18. The collector of transistor 18 is connected through the secondary of pulse transformer 30 and through bias resistor 32 back to load 24. Resistor 32 provides bias for the base of transistor 20.

Bias resistor 34 is connected between emitter and base of transistor 10, while the base of transistor 10 is connected to the collector of transistor 12. The base of transistor 12 is connected to the collector of transistor 10, while its emitter is connected to the collector of transistor 16 and to the base of transistor 14. The base of transistor 16 is connected to the collector of transistor 14. The emitter of transistor 16 is connected to the base of transistor 18 and to the collector of transistor 20. The base of transistor 20 is connected to the collector of transistor 18, while the emitter of transistor 20 is connected to load 24. In the configuration shown, the PNP transistors are the majority current carriers.

For the purpose of description of circuit operation, it is assumed that the transistors are first in the off state. This state is stable with the proper selection of transistor components. The voltage is fairly equally divided across each of the series connected complementary pairs, and if further protection is desired to prevent over voltage of one or more transistors due to uneven leakage in the off state, series connected resistors of fairly high value can be connected in parallel across each of the complementary pair stages in order to maintain this equality.

Pulse transformer 36 has its secondary connected between the base and the emitter of transistor 20 through diode 38. Pulse transformer 36 has its primary connected to receive an ON pulse when conductivity of the transistor switches is desired. When so pulsed, the base of transistor 20 is made positive with respect to its emitter, with current flowing through diode 38. Diode 38 is placed in the pulse transformer secondary circuit to prevent shorting out the base to emitter on transistor 20. Such a pulse causes current flow from base to emitter, and since there is voltage applied across the transistor from collector to base, the transistor is on, permitting collector to emitter current flow. The flow of collector current in transistor 20 causes base current to flow in transistor 18 causing a regenerative feedback driving both transistors 18 and 20 into saturation. The turn on of transistor 18 causes its base to emitter voltage to increase. This base to emitter voltage increase appears across the base to emitter of transistor 16. This base-to-emitter voltage applied to transistor 16, causes its conduction similarly to the original pulse on transistor 20. This action proceeds serially down the series connected complementary pairs until all of them are turned on. The criteria for regenerative turn on of each complementary pair is that the product of the gains in the pair must be greater than one.

In theoretical consideration, it appears that the transistor switches progressively turn on. In such a situation, the last ones to turn on would be subjected to an over voltage. However, these transistor switches turn on so fast that in actual measurement no increase in voltage over that withstood in the off state was detected on any transistor. Thus, no voltage equalization is necessary during the turn-on transition.

When in the conductive state, each transistor is biased in the conducting direction. This bias is provided for transistors 10 and 20 by resistors 34 and 32, respectively. The remaining transistors are biased by the base-to-emitter voltage drop through the transistors with which they are associated. The criteria of a stable conductive condition for each complementary pair is that the product of the gains in the pair must be equal to $I_{g_{PNP}}/I_{b_{NPN}}$. This is one of the criteria used in selecting the transistors in the complementary pairs.

Pulse transformer 40 is connected between the emitter and base of transistor 10. This pulse transformer is used to impress a reverse bias pulse between base and emitter of transistor 10 in order to turn it off.

Forming the capacitor-transformer voltage equalization network of this invention is capacitor 42 and the primary of pulse transformer 26 serially connected between the base of transistors 10 and 14. Similarly, capacitor 44 and the primary of transformer 28 are serially connected between the bases of transistors 14 and 18. Additionally, capacitor 46 and the primary of transformer 30 are serially connected between the base and collector of transistor 18. Diodes 48, 50 and 52 are respectively paralleled across the primaries of transformers 26, 28 and 30.

Assuming that the transistor switches are in the conductive state, and it is desired to turn them off, an off pulse is applied to transformer 40. This pulse reverse biases transistor 10 to turn it off. With transistor 10 turning off, transistor 12 is robbed of base current. This reduced base current into transistor 12 results in further reduced base current drive to transistor 10 with a resultant regenerative feedback driving both transistors 10 and 12 to their unsaturated state. With transistor 12 turning off, there is less voltage across the base to emitter on transistor 12. This is the controlling voltage on the emitter to base junction of transistor 14 and causes transistor 14 to turn off. Thus, the turnoff signal is propagated down the line of series connected complementary pairs until all of them are turned off. The criteria for regenerative turnoff of each complementary pair is that the product of the gains in the pair must be made less than one.

However, this signal will not be so quickly propagated as the turn-on signal due to transistor stored charge so that there is a real danger of applying an over voltage on any one of the transistors because each is not carrying its share of the total voltage from source 22 which is to be turned off.

More generally, to obtain uniform voltage distribution across series connected switch elements, it is necessary to do two things. First, force all switch elements to have equal change in voltage with respect to time during rise and fall time intervals. Second, it is necessary to force all switch elements to initiate turn-on and turnoff simultaneously, independent of delay times, storage time or nonuniform receipt of turn-on and turnoff signals. As is described above, these conditions are satisfactorily met for the basic circuit during the turn-on transition, but equalization is necessary to obtain satisfactorily uniform voltage distribution during the turnoff transition.

Furthermore, there are two approaches to obtaining the uniform voltage distribution during the turnoff transition. First, either all switches must be forced to operate as quickly as the fastest switch, or all switches must be forced to operate as slow as the slowest switch. Thus, due to the physical limitations of storage times of the individual transistors, each of the switch elements shown in the drawing is driven to turn off substantially simultaneously, at the speed of the slowest switch element, in order to obtain the desired uniform voltage distribution.

Returning to capacitor 42, by design the voltage drop through pulse transformer 26 is small, and the voltage drop from emitter to base on transistor 14 is fairly small, especially as compared to the collector to base voltage drop on transistor 10. Thus, the voltage across capacitor 42 is quite large and is substantially equal to the collector-to-base voltage of transistor 10. Thus, it is clear that the capacitor displacement current in capacitor 42 is proportional to the change in the collector to base voltage of transistor 10 with respect to time. The capacity of capacitor 42 is selected so that the capacitor displacement current is larger than the load current. Furthermore, each of the capacitors 42, 44 and 46 has substantially the same capacity so that the capacitor displacement currents of each of these capacitors are substantially equal. As a result of this, the change in collector to base voltage with respect to time of each of the capacitors 10, 14 and 18, becomes substantially equal. Thus, the capacitors force the change in voltage from collector to base of each of these transistors with respect to time to be substantially equal to that of the other transistors. Thus, the rates of voltage rise across each capacitor and across each transistor collector to base must be substantially equal.

This action in itself is not sufficient to prevent the application of over voltage to a given transistor. For example, it is assumed that all the transistors in the drawing have equal rise and fall times, equal delay and storage times and simultaneous receipt of the off signal, except for transistor 18 which has less storage time. Upon pulsing the series connected transistor switches toward the off state, transistor 18 would turn off before all of the others, when the off pulse was generated. However, displacement current would continue to flow into capacitor 46, since all other switch elements are still turning off. This flow of displacement current would cause the voltage across capacitor 46 to rise and impress an over voltage on transistor 18, even if transistor 18 would not have already become over voltaged by being the first transistor turned off.

It is to avoid this problem that the pulse transformers 26, 28 and 30 are placed in the circuit. The purpose of the pulse transformers is to use the capacitor displacement current to modify the fall time of the associated transistor switches by controlling the transistor base drive to thus control the turnoff characteristics of the switch. Thus, the capacitors function to equalize the rate of change of voltage across the individual switch elements, and the capacitor displacement current is employed through a pulse transformer to slow the transition speed of the switch element which is first turning off and allow its transition speed to approach that of the lower transition speed switch elements.

The capacitor displacement current flowing through capacitor 42 also flows through the primary of pulse transformer 26. The pulse in the primary creates a pulse in the secondary of this transformer which appears between the emitter and base of transistor 14. This secondary transformer voltage is of such a polarity to act as a pulse in the turnoff direction of transistor 14, but also acts to pulse transistor 12 in the turn-on direction. However, the rising voltage in the secondary is more effective in the turnoff of transistor 14 than the turn-on of transistor 12, since transistor 14 has a turnoff signal thereon which is the sum of the transformer secondary voltage and the base to emitter voltage of transistor 12. The sum voltage is always of such a polarity to drive transistor 14 to turnoff. The re-turn on of transistor 12 slows down the turnoff speed of the complementary pair switch element composed of transistors 10 and 12. Since it was previously shown that the voltage change with respect to time applied to each of the capacitors was substantially equal and of a time duration determined by the slowest switch element turning off, this means that the pulses produced by this capacitor displacement current act equally. Thus, the pulse voltages in the secondaries act to aid switch element drive turnoff while at the same time reduce the turnoff transition speed of the switch elements. These voltages are applied at substantially the same time, and this is the time of the slowest switch element to turnoff. By this means, the faster switches are delayed in their turnoff toward the turnoff speed of the slowest switch.

At the end of the turnoff period, the displacement current through capacitors 42, 44 and 46 decreases to zero. The energy remaining in transformers 26, 28 and 30 discharged causing a pulse of reverse polarity to appear across the pulse transformer windings called backswing. This backswing voltage pulse is of such a polarity to act as a turn-on signal to each complementary pair switch element. Diodes 48, 50 and 52 clamp this pulse transformer backswing voltage and holds it to a negligible value.

Diodes 48, 50 and 52 also bypass the pulse transformers during normal turn on allowing capacitors 42, 44 and 46 to discharge more rapidly.

This invention having been described in its preferred embodiment, it is clear that it is susceptible to numerous modifications and embodiments within the ability of those skilled in the art and without the exercise of the inventive faculty. Accordingly, the scope of this invention is defined by the scope of the following claims.

We claim:

1. A voltage equalization network for series connected transistor switches, said network comprising:

a plurality of transistor switches serially connected, including first, second and last transistor switches, so that the collector of said first transistor switch is connected to the emitter of said second transistor switch in the series;

pulse means connected to the base of at least one of said series connected transistors to apply a pulse to the base of said first serially connected transistor switch to bias said first serially connected transistor switch to its high-impedance condition;

bias means connected to the base of each of said serially connected transistors to maintain all of said serially connected transistors in their high-impedance condition when said first serially connected transistor is biased to its high-impedance condition; and a capacitor connected between the base and collector of each transistor of said serially connected transistors, a transformer connected in association with each of said capacitors.

2. The voltage equalization network for series connected transistor switches of claim 1 wherein said transformer has a primary coil and has a secondary coil, said primary coil being serially connected with its associated capacitor and having its secondary coil serially connected with the collector of the associated transistor of the series connected transistor switches.

3. The voltage equalization network for series connected transistor switches of claim 2 wherein the displacement current flowing through said capacitor associated with said first serially connected transistor switch flows through the primary of said associated transformer to apply a voltage to the collector of said first transistor switch in such a direction as to reduce current flow through said first transistor switch.

4. A voltage equalization network for series connected transistor switches, said network comprising:

a plurality of transistor switches serially connected, including first, second and last transistor switches, so that the collector of said first transistor switch is connected to the emitter of said second transistor switch in the series, said plurality of transistor switches being connected as a plurality of complementary transistor pairs, each complementary transistor pair comprising one of said serially connected switches, each transistor in a complementary transistor pair having its base connected to the collector of the opposite transistor in said complementary pair;

pulse means connected to the base of at least one of said series connected transistors to apply a pulse to the base of said first serially connected transistor switch to bias said first serially connected transistor switch to bias said first serially connected transistor switch to its high impedance condition;

bias means connected to the base of each of said serially connected transistors to maintain all of said serially connected transistors in their high-impedance condition when said first serially connected transistor is biased to its high-impedance condition; and a capacitor connected between the base and collector of each transistor of said serially connected transistors.

5. The voltage equalization network for series connected transistor switches of claim 4 wherein said capacitors are connected so that one capacitor is connected between the collector and base of each serially connected transistors of the same type.

6. The voltage equalization network for series connected transistor switches of claim 5 wherein a transformer is serially connected with each of said capacitors, each of said transformers having a primary and a secondary coil, with the primary coil serially connected to the associated capacitor, and with the secondary coil serially connected with the collector of the associated transistor switch.

7. The voltage equalization network for series connected transistor switches of claim 6 wherein said means to change said serially connected complementary transistor pairs from their low-impedance to their high-impedance state comprises pulse means connected to one of said transistor switches to bias said one transistor switch from its low-impedance to its high-impedance state, the remaining transistors in said series connected transistor switches being connected to be biased to their high-impedance state by biasing said first transistor switch to its high-impedance state.

8. The voltage equalization network for series connected transistor switches of claim 7 wherein further biasing means is connected to said series connected transistor switches, said further biasing means being connected to one of said transistor switches to bias said one of said transistor switches to cause it to change from its high-impedance to its low-impedance state, the remaining transistor switch being connected to said one transistor switch so that when said one transistor switch is biased to its low-impedance state, the remaining transistor switches are biased to their low-impedance state.